(12) United States Patent
Nakata et al.

(10) Patent No.: US 6,268,432 B1
(45) Date of Patent: Jul. 31, 2001

(54) FILLER/ADHESIVE AGENT FOR DISPLAY UNITS CONTAINING A CURABLE SILICONE COMPOSITION

(75) Inventors: Toshiki Nakata; Masayuki Onishi, both of Chiba Prefecture (JP)

(73) Assignee: Dow Corning Toray Silicone Co. Ltd., Tokyo (JP)

( * ) Notice: Subject to any disclaimer, the term of this patent is extended or adjusted under 35 U.S.C. 154(b) by 0 days.

(21) Appl. No.: 09/409,504

(22) Filed: Sep. 30, 1999

(30) Foreign Application Priority Data

Oct. 1, 1998 (JP) .................................................. 10-280157
Oct. 23, 1998 (JP) .................................................. 10-302046
Oct. 23, 1998 (JP) .................................................. 10-302047

(51) Int. Cl.$^7$ .............................. C08K 5/09; C08L 83/06
(52) U.S. Cl. ......................... 524/588; 556/458; 556/459; 556/470; 524/401; 524/425; 524/493; 524/497; 524/437; 524/448; 524/356; 524/284; 523/213

(58) Field of Search ..................................... 524/284, 356, 524/213, 448, 437, 497, 493, 425, 401, 588; 556/470, 459, 458

(56) References Cited

FOREIGN PATENT DOCUMENTS

215215 * 3/1987 (EP) .
5190905 7/1993 (JP) .

* cited by examiner

Primary Examiner—Robert Dawson
Assistant Examiner—Kuo-Liang Peng
(74) Attorney, Agent, or Firm—Timothy J. Troy; Rick D. Streu

(57) ABSTRACT

A filler/adhesive agent for display units containing a condensation reaction curable silicone composition including air oxidation-curable unsaturated compounds and for use as a filler or adhesive in display units whose construction is such that the cured product of said composition is exposed in the display section, which composition is capable of forming matte finished cured products with insignificant surface tact, is disclosed.

16 Claims, 2 Drawing Sheets

FILLER/ADHESIVE AGENT FOR DISPLAY UNITS CONTAINING A CURABLE SILICONE COMPOSITION

FIELD OF THE INVENTION

The present invention relates to filler/adhesive agents used in display units, and, more specifically, to a filler/adhesive agent for display units whose construction is such that the cured product of said filler/adhesive agent is exposed in the display section and which is capable of forming cured products possessing a superior matte finish by curing through a condensation reaction. Furthermore, the present invention relates to a curable silicone composition capable of forming matte finished cured products with insignificant surface tack by curing through a condensation reaction.

BACKGROUND OF THE INVENTION

Light-emitting diode (LED) display units having a plurality of LEDs (light-emitting diodes) mounted on a substrate are used as signaling devices, traffic control signs, or advertisement display boards, and the like. LED display units used outdoors, for waterproofing purposes, having the gaps between the LEDs being filled and sealed with silicone cured products have been disclosed for example in Japanese Patent Publication However, a problem with certain LED display units, for example in the invention disclosed in Japanese Patent Publication No. 5-190905, is that when the silicone cured product used for filling and sealing the gaps between the LEDs is exposed, the visibility of the lit LEDs and unlit LEDs in light incident from the outside, for example, sunlight, deteriorates.

For this reason, attempts have been made to impart a matte finish to the resultant cured products by admixing inorganic fillers to condensation reaction curable silicone compositions. It is, however, difficult to impart a sufficient matte finish, and a large amount of fillers need to be admixed in order to impart the matte finish, causing a reduction in the flowability of the resultant curable silicone composition and a deterioration in its handling properties.

It is an object of the present invention to provide a filler/adhesive agent for display units whose construction is such that the cured product of the filler/adhesive agent is exposed in the display section and which is capable of forming a cured product possessing a superior matte finish by curing through a condensation reaction.

A further object of the present invention is to provide an LED display device which is characterized by the fact that in an LED display device in which the gaps between a plurality of LEDs mounted on a substrate are filled with a cured silicone product, and in which the LEDs and the cured silicone product are exposed, the visual recognition characteristics of the lit LEDs versus the unlit LED's are superior, even in cases where light is incident from the outside.

A further object of the present invention to provide a curable silicone composition capable of forming matte finished cured products with insignificant surface tack by curing through a condensation reaction.

DETAILED DESCRIPTION OF THE INVENTION

The present invention relates to a filler/adhesive agent for display units containing a condensation reaction curable silicone composition, comprising an air oxidation-curable unsaturated compound and intended for use as a filler or adhesive in display units whose construction is such that the cured product of said composition is exposed in the display section.

The LED display device of the present invention is characterized by the fact that in an LED display device in which the gaps between a plurality of LEDs mounted on a substrate are filled with a cured silicone product, and these LEDs and cured silicone product are exposed, the 60-degree mirror surface luster Gs(60°) of the surface of the cured silicone product is 20% or less.

A detailed explanation of the filler/adhesive agent for display units of the present invention is provided hereinbelow.

Figure 1:
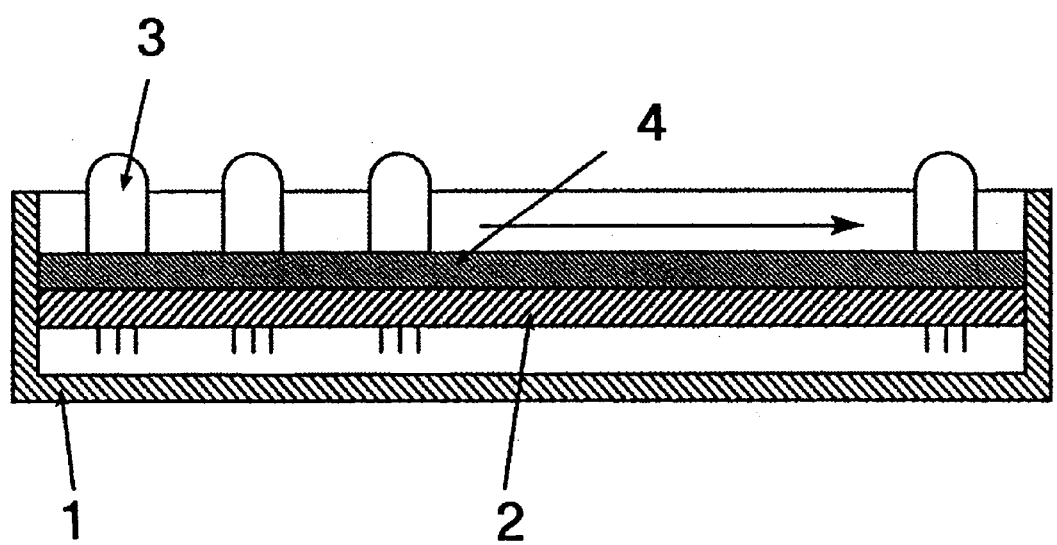
FIG. 1 is a sectional view of an embodiment of the LED device of the present invention.
Figure 2:
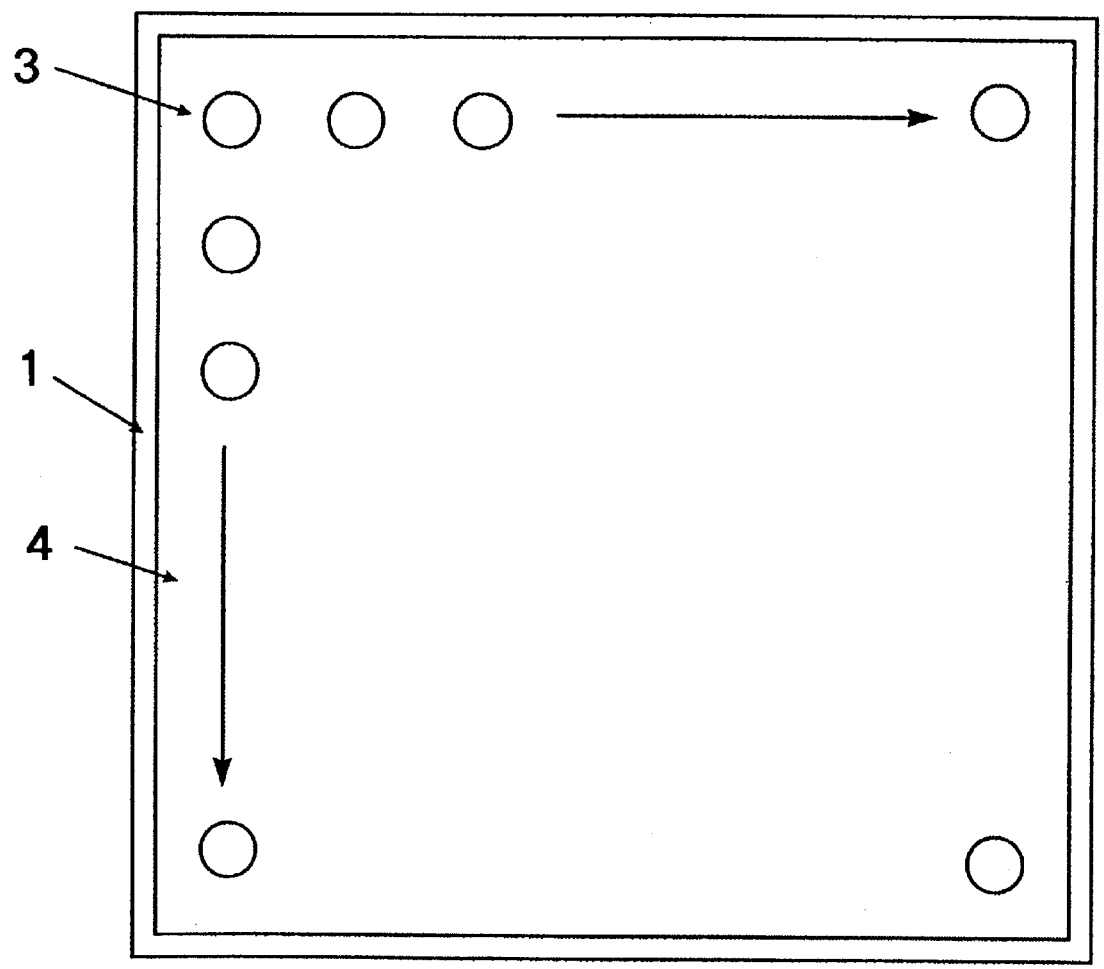
FIG. 2 is a view of the upper surface of an embodiment of the LED device of the present invention.

The display units where the filler/adhesive agent of the present invention can be applied are those units having a structure, wherein the cured product of said filler/adhesive agent is exposed in the display section of said display unit, for instance, an LED display unit such as the one shown in FIG. 1 (cross sectional view) and FIG. 2 (top view). In the LED display unit shown in FIG. 1, a substrate (2) is arranged on a frame (1), with a plurality of LEDs (3) mounted on said substrate (2). Then, for waterproofing and protecting the LEDs from vibration, the gaps between these LEDs (3), as well as the gap between the LEDs (3) and the frame (1) are filled and sealed with a silicone cured product (4). In addition, as shown in FIG. 2, the LEDs of the LED display unit can be mounted on the substrate in a regular fashion, or mounted in a pictorial fashion, exposing the silicone cured product (4) that fills the gaps between the LEDs (3) mounted on the substrate as well as the gap between the LEDs and the frame (1).

The filler/adhesive agent for display units of the present invention is characterized by containing a condensation reaction curable silicone composition comprising air oxidation-curable unsaturated compounds. Dealcoholation, deoximation, acetic acid elimination, deamidation, acetone elimination, and hydroxylamine elimination are suggested as the mechanisms used for curing the condensation reaction curable silicone composition. A composition comprising (A) an air oxidation-curable unsaturated compound, (B) a polyorganosiloxane having at least two silicon atom-bonded hydrolyzable groups or silanol groups in one molecule, and (C) a cross-linking agent is a preferred embodiment of the condensation reaction curable silicone composition of the present invention.

The above mentioned component (A) is an air oxidation-curable unsaturated compound, and is a component used for imparting a sufficient matte finish to the cured products obtained by curing the above mentioned composition. Preferably, such a component (A) is a compound curing through the oxidation of the unsaturated bonds in the molecule by the atmospheric oxygen and having at least two aliphatic unsaturated carbon-carbon bonds in one molecule. Preferably, it is at least one compound selected from the group consisting of unsaturated higher fatty acids, unsaturated higher fatty acid esters, unsaturated hydrocarbons, and their polymers, more particularly, linoleic acid, linolenic acid, linolic acid, and other unsaturated higher fatty acids; oils consisting of esters of glycerin and unsaturated higher fatty acids, such as tung oil, linseed oil, soybean oil, and the like; esters of alcohols and unsaturated higher fatty acids, such as methyl linolenate, methyl linolate, and the like; butadiene, 1,3-pentadiene, 1,4-pentadiene, 1,3-hexadiene, 1,4-hexadiene, 1,5-hexadiene, 1,3,5-hexatriene, and other linear unsaturated hydrocarbon compounds; 1,3-cyclopentadiene, 1,4-cyclopentadiene, 1,3-cyclohexadiene, 1,4-cyclohexadiene, 1,5-cyclohexadiene, 1,3-cycloheptadiene, 1,4-cycloheptadiene, 1,5-cycloheptadiene, 1,3,5-cycloheptatriene, 1,3,6-cycloheptatriene, and other cyclic unsaturated hydrocarbon compounds; their polymers; or mixtures of two or more of the compounds above are suggested as examples, with linoleic acid, linolic acid, tung oil, linseed oil, soybean oil, methyl linolenate, methyl linolate, butadiene, pentadiene, hexadiene, cyclopentadiene, cyclohexadiene, cycloheptatriene, or mixtures of two or more of the compounds above being preferred, and, furthermore, linoleic acid, linolic acid, tung oil, linseed oil, soybean oil, methyl linolenate, methyl linolate, butadiene, pentadiene, 1,3-hexadiene, cyclopentadiene, 1,3-cyclohexadiene, 1,3,5-cycloheptatriene, or mixtures of two or more of the compounds above being particularly preferred.

The content of component (A) in the above mentioned composition may be within the range of from 0.01 wt % to 30 wt %, preferably, in the range of from 0.05 wt % to 20 wt % and, most preferably, within the range of from 0.1 wt % to 10 wt %. Note that if the content of component (A) is less than the lower limit of the above mentioned range, imparting a sufficient matte finish to the resultant cured product tends to become impossible, and, on the other hand, if it exceeds the upper limit of the above mentioned range, the mechanical characteristics of the resultant cured product tend to deteriorate.

The above mentioned component (B) is a polyorganosiloxane having at least two silicon atom-bonded hydrolyzable groups or silanol groups in one molecule. For example, methoxy, ethoxy, propoxy and other alkoxy groups; vinyloxy and other alkenoxy groups; methoxyethoxy, ethoxyethoxy, methoxypropoxy, and other alkoxyalkoxy groups; acetoxy, octanoyloxy, and other acyloxy groups; dimethylketoxime, methylethylketoxime, and other ketoxime groups; isopropenyloxy, 1-ethyl-2-methylvinyloxy and other alkenyloxy groups; dimethylamino, diethylamino, butylamino, and other amino groups; dimethylaminoxy, diethylaminoxy, and other aminoxy groups; N-methyl acetamide, N-ethyl acetamide, and other amide groups are suggested as the silicon atom-bonded hydrolyzable groups. In addition, methyl, ethyl, propyl, and other alkyl groups; cyclopentyl, cyclohexyl, and other cycloalkyl groups; vinyl, allyl, and other alkenyl groups; phenyl, naphthyl, and other aryl groups; 2-phenylethyl and other aralkyl groups; and groups obtained by substituting halogen atoms for some or all of the hydrogen atoms in the above groups are suggested as silicon atom-bonded groups other than the silicon atom-bonded hydrolyzable groups and silanol groups in compound (B).

The molecular structure of component (B) may be, for instance, linear, linear with partial branching, branched, cyclic, and resinous structures, with linear structures being particularly preferred. In addition, although there are no limitations concerning the viscosity of component (B), a range of from 20 mPa·s to 100,000 mPa·s at 25° C. is preferable, and a range of from 100 mPa·s to 100,000 mPa·s is particularly preferred. Note that if viscosity at 25° C. is less than the lower limit of the above mentioned range, the physical characteristics of the resultant cured products tend to decrease, and, on the other hand, if it exceeds the upper limit of the above mentioned range, the handling properties of the resultant composition tend to deteriorate.

The above mentioned cross-linking agent, component (C), is used for curing the above mentioned composition; it is also a component used for improving the storage stability of the composition when the above mentioned composition is a one-solution curable silicone composition. Silane compounds represented by the general formula: $R_aSiX_{4-a}$ or products of partial hydrolytic condensation thereof are suggested as examples of such cross-linking agents of component (C). R in the above formula is at least one group selected from the group consisting of monovalent hydrocarbon groups, epoxy-functional monovalent organic groups, and acrylic-functional monovalent organic groups, with methyl, ethyl, propyl, butyl, pentyl, hexyl, heptyl, octyl, nonyl, decyl, octadecyl, and other alkyl groups, cyclopentyl, cyclohexyl, and other cycloalkyl groups, vinyl, allyl, and other alkenyl groups, phenyl, tolyl, xylyl, naphthyl, and other aryl groups, benzyl, phenethyl, phenylpropyl, and other aralkyl groups, 3-chloropropyl, 3,3,3-trifluoropropyl, and other halogenated alkyl groups suggested as examples of the monovalent hydrocarbon groups represented by R; 4-oxylanylbutyl, 8-oxylanyloctyl, and other oxylanylalkyl groups, 3-glycidoxypropyl, 4-glycidoxybutyl, and other glycidoxyalkyl groups, and 2-(3,4-epoxycyclohexyl)ethyl suggested as examples of the epoxy-functional monovalent organic groups represented by R; and, furthermore, 3-methacryloxypropyl and 4-methacryloxybutyl suggested as examples of the acrylic-functional monovalent organic groups represented by R. In addition, in the formula above, the subscript a may be 0, 1, or 2, with 1 being particularly preferred. Also, X in the formula above represents a silicon atom-bonded hydrolyzable group, with methoxy, ethoxy, propoxy, or another alkoxy group, methoxyethoxy, ethoxyethoxy, methoxypropoxy, or another alkoxyalkoxy group, acetoxy, octanoyloxy, or another acyloxy group, dimethylketoxime, methylethylketoxime, or another ketoxime group; isopropenyloxy, 1-ethyl-2-methylvinyloxy, or another alkenyloxy group; dimethylamino, diethylamino, butylamino, or another amino group, dimethylaminoxy, diethylaminoxy, or another aminoxy group, and N-methyl acetamide, N-ethyl acetamide, or another amide group suggested as examples thereof. In addition, the silicon atom-bonded hydrolyzable group X of component (C) is, preferably, the same, or belongs to the same type as the above described silicon atom-bonded hydrolyzable groups of component (B).

In the above mentioned composition, the content of component (C) is, preferably, within the range of from 0.01 parts by weight to 20 parts by weight per 100 parts by weight of the above mentioned component (B), and, most preferably, within the range of from 0.1 parts by weight to 10 parts by weight per 100 parts by weight of the above mentioned component (B). This is due to the fact that if the content of component (C) is less than the lower limit of the above mentioned range, the storage stability of the resultant composition decreases, and its adhesive properties tend to decrease as well, while, on the other hand, if its amount exceeds the upper limit of the above mentioned range, the cure of the resultant composition tends to become conspicuously slow.

Catalysts promoting the condensation reaction can be added to such a condensation reaction curable silicone composition as optional components. The choice of the condensation reaction catalyst depends on the type of the above mentioned component (C), but, for example, when the composition contains a cross-linking agent having aminoxy, amino, ketoxime groups, etc., it is not required. Tetrabutyl titanate, tetraisopropyl titanate, and other organo titanates, diisopropoxybis(acetylacetate) titanium, diisopropoxybis (ethylacetoacetate) titanium, and other chelated organotitanium compounds, aluminum tris(acetylacetonate), aluminum tris(ethylacetoacetate), and other organoaluminum compounds, zirconium tetra(acetylacetonate), zirconium tetrabutylate, and other organoaluminum compounds, dibutyltin dioctanoate, dibutyltin dilaurate, butyltin-2-ethylhexanoate and other organotin compounds, stannous naphthenate, stannous oleate, stannous butylate, cobalt naphthenate, zinc stearate, and other metal salts of organic carboxylic acids, hexylamine, dodecylamine phosphate, and other amine compounds, as well as their salts, benzyltriethylammonium acetate, and other quaternary ammonium salts, potassium acetate, lithium nitrate, and other lower fatty acid salts of alkali metals, dimethylhydroxylamine, diethylhydroxylamine, and other dialkylhydroxylamines, guanidyl-containing organosilicon compounds, and the like, are suggested as examples of such condensation reaction catalysts.

Furthermore, other optional components, for example, fumed silica, wet silica micropowder, quartz micropowder, calcium carbonate micropowder, magnesium carbonate micropowder, iron oxide, titanium dioxide micropowder, diatomaceous earth micropowder, aluminum oxide micropowder, aluminum hydroxide micropowder, zinc oxide micropowder, zinc carbonate micropowder, and other inorganic fillers; hydrophobic inorganic fillers obtained by surface treating the above mentioned inorganic fillers with methyltrimethoxysilane and other organoalkoxysilanes; trimethylchlorosilane and other organohalosilanes; hexamethyldisilazane and other organosilazanes, hydroxy-terminated dimethylsiloxane oligomers, hydroxy-terminated methylphenylsiloxane oligomers, hydroxy-terminated methylvinylsiloxane oligomers, and other siloxane oligomers; toluene, xylene, acetone, methylethylketone, methyl isobutyl ketone, hexane, heptane, and other organic solvents; trimethylsiloxy-terminated polydimethylsiloxanes, trimethylsiloxy-terminated polymethylphenylsiloxanes, and other non-crosslinkable organopolysiloxanes; carbon black, red iron oxide, and other pigments; and, in addition to the above, flame resistance-imparting agents, heat resistance-imparting agents, sensitizers, polymerization inhibitors, anti-oxidants, internal mold release agents, plasticizers, thixotropicity-imparting agents, adhesion accelerators, and fungicides can be admixed with the above mentioned composition.

The filler/adhesive agent for display units of the present invention is capable of forming cured products possessing a superior matte finish by curing through a condensation reaction, and because the cured products are not prone to cracking due to thermal expansion and contraction and resist scratching, it is preferable to use them in gel or rubber form, with the rubber form being particularly preferred. In addition, it is preferred that the color of the composition should be black because this minimizes irregular reflection of incident light from outside and provides for superior visibility of the obtained display unit.

A method which includes arranging a substrate having a plurality of LEDs mounted thereon in a package, such as a frame, followed by sealing said LEDs with said filler/adhesive agent for waterproofing said LEDs and protecting them from vibration, whereupon said composition is allowed to stand at room temperature or heated, is suggested as a method of fabrication of display units using the filler/adhesive agent for display units of the present invention.

Because the filler/adhesive agent for display units of the present invention provides for enhanced visibility of the display elements in light incident from the outside even though the cured product of said filler/adhesive agent is exposed in the display section, it is useful as a filler/adhesive agent for LED display units used outdoors, such as signaling devices, traffic control signs, or advertisement display boards, and the like.

EXAMPLES

The filler/adhesive agent for display unit of the present invention is explained in detail by referring to the following examples. In the examples, "viscosity" refers to values obtained at 25° C., "glossiness" refers to 60-degree mirror surface glossiness Gs (60°), as measured at an optical source incidence angle of 60° and a light reception angle of 60°, with the surface tack of the cured silicone product evaluated by the presence/absence of fingerprint transfer after applying pressure with a finger.

Example 1

A silicone rubber composition was prepared by homogeneously mixing 100 parts by weight of a trimethoxysiloxy-terminated polydimethylsiloxane having a viscosity of 5,000 mPa·s, 10 parts by weight of fumed silica surface-treated with hexamethyldisilazane and having a specific surface area of 200 $m^2/g$ as measured by the BET method, and 5 parts by weight of carbon black, followed by mixing in 2 parts by weight of diisopropoxybis(ethylacetoacetate) titanium, 2 parts by weight of methyltrimethoxysilane, and 2 parts by weight of tung oil. The 60-degree mirror surface glossiness Gs (60°) of the silicone rubber obtained by curing the silicone rubber composition by allowing it to stand for one week in air at a temperature of 25° C. and a humidity of 55% was 0%.

Next, after arranging a substrate having LEDs mounted thereon in the form of a matrix on a frame, the above mentioned silicone rubber composition was used to fill the gaps so that the LEDs were left exposed. An LED display unit was fabricated by curing the silicone rubber composition by allowing it to stand for one week in air at a temperature of 25° C. and a humidity of 55%. When sunlight was illuminating the screen of the LED display unit, some of the LEDs were lit while viewing the screen from the direction of regular reflection of the sunlight by the screen, and the visibility of the lit LEDs and unlit LEDs was excellent.

Example 2

A silicone rubber composition was prepared in the same manner as in Example 1, with the exception of adding 0.5 parts by weight of methyl linolenate instead of tung oil. The 60-degree mirror surface glossiness Gs (60°) of the silicone rubber obtained by curing the silicone rubber composition was 0%.

Next, an LED display unit was fabricated in the same manner as in Example 1. When sunlight was illuminating the screen of the LED display unit, some of the LEDs were lit while viewing the screen from the direction of regular reflection of the sunlight by the screen, and the visibility of the lit LEDs and unlit LEDs was excellent.

Example 3

A silicone rubber composition was prepared by homogeneously mixing 100 parts by weight of silanol-terminated polydimethylsiloxane having a viscosity of 15,000 mPa·s, 10 parts by weight of fumed silica surface-treated with hexamethyldisilazane and having a specific surface area of 200 m²/g, and 5 parts by weight of carbon black, followed by mixing in 0.5 parts by weight of dibutyltin dilaurate, 15 parts by weight of methyltri(methylethylketoxime)silane, and 0.5 parts by weight of 1,3-hexadiene. The 60-degree mirror surface glossiness Gs (60°) of the silicone rubber obtained by curing the silicone rubber composition in the same manner as in Example 1 was 0%; in addition, there was no transfer of fingerprints to the surface of the silicone rubber and its tack was insignificant.

Next, an LED display unit was fabricated in the same manner as in Example 1. When sunlight was illuminating the screen of the LED display unit, some of the LEDs were lit while viewing the screen from the direction of regular reflection of the sunlight by the screen, and the visibility of the lit LEDs and unlit LEDs was excellent.

Comparative Example 1

A silicone rubber composition was prepared in the same manner as in Example 1, but without adding tung oil as in Example 1. The 60-degree mirror surface glossiness Gs (60°) of the silicone rubber obtained by curing was 60%.

Next, an LED display unit was fabricated in the same manner as in Example 1. When sunlight was illuminating the screen of the LED display unit, some of the LEDs were lit while viewing the screen from the direction of regular reflection of the sunlight by the screen, the contrast between the lit LEDs and unlit LEDs was not sharp, and visibility was poor.

Thus, the filler/adhesive agent for display units of the present invention is constructed such that the cured product of the filler/adhesive agent is exposed in the display section, and is capable of forming the cured product possessing a superior matte finish by curing through a condensation reaction, thereby improving the visibility of the display unit.

Example 4

A curable silicone composition was prepared by homogeneously mixing 100 parts by weight of a trimethoxysiloxy-terminated polydimethylsiloxane having a viscosity of 15,000 mPa·s, 10 parts by weight of fumed silica surface-treated with hexamethyldisilazane and having a specific surface area of 200 m²/g, and 5 parts by weight of carbon black, followed by mixing in 2 parts by weight of diisopropoxybis(ethylacetoacetate) titanium, 2 parts by weight of methyltrimethoxysilane, and 0.5 parts by weight of linolenic acid. Next, the curable silicone composition was allowed to stand for one week in air at a temperature of 25° C. and a humidity of 55% RH. The 60-degree mirror surface glossiness Gs (60°) of the resultant silicone rubber was 0%; in addition, there was no transfer of fingerprints to the surface of the silicone rubber and its tack was insignificant.

Comparative Example 2

A curable silicone composition was prepared in the same manner as in Example 4, but without adding linolenic acid as in Example 4. The curable silicone composition was cured in the same manner as in Example 4. The 60-degree mirror surface glossiness Gs (60°) of the resultant silicone rubber was 60%, in addition, there was transfer of fingerprints to the surface of the silicone rubber and the surface exhibited considerable tack.

Thus, the curable silicone composition of the present invention is characterized by being capable of forming matte finished cured products with insignificant surface tack by curing through a condensation reaction.

In the LED display device of a preferred embodiment of the present invention, as is shown in FIG. 2, the silicone cured product 4 filling the gaps between the respective LEDs 3 mounted on the substrate, and the gaps between these LEDs 3 and the frame 1, is exposed; however, since the 60-degree mirror surface luster Gs(60°) of this silicone cured product is 20% or less, the visual recognition characteristics of lit LEDs versus unlit LEDs are superior even when light is incident from the outside. In order to obtain a material that is resistant to cracking caused by thermal expansion and contraction, and that is also resistant to scratching, it is desirable that the above-mentioned silicone cured product be a gel-form or rubber-form product, and a rubber-form product is especially desirable. Furthermore, so that there is little random reflection of light incident from the outside, and so that the visual recognition characteristics of the LED display device obtained are superior, it is desirable that the color of the above-mentioned silicone cured product be black.

In the LED display device of a preferred embodiment of the present invention, it is desirable that the cured silicone product that fills the respective LEDs be a product that is formed by curing a curable silicone composition which contains a compound that has air-oxidation-curable unsaturated groups. This compound that has air-oxidation-curable unsaturated groups is a component that is used to deluster the surface of the cured silicone product that is obtained by curing the aforementioned curable silicone composition. Such compounds possessing air-oxidation-curable unsaturated groups are generally compounds with unsaturated groups in the molecule that are caused to undergo polymerization by oxygen contained in the air. Examples of such compounds include unsaturated higher fatty acids such as linoleic acid, linolenic acid, and linolic acid, fats and oils consisting of esters of unsaturated higher fatty acids and glycerol, such as tung oil, linseed oil and soybean oil, as well as alkyl resins obtained by modifying such compounds; ester compounds of unsaturated fatty acids and alcohols, such as methyl linolenate and methyl linolate, hydrocarbon compounds with unsaturated groups in the molecule, such as butadiene, pentadiene and hexadiene, as wells as polymers of such hydrocarbon compounds, and silicone compounds modified by such compounds. In particular, linolenic acid, methyl linolenate, tung oil and 1,3-hexadiene are especially desirable. Such compounds with air-oxidation-curable unsaturated groups may be added singly to the curable silicone composition, or may be added as mixtures containing two or more compounds.

In this curable silicone composition, it is desirable that the content of the abovementioned air-oxidation-curable unsaturated compound be in the range of 0.01 to 50 parts by weight per 100 parts by weight of the silicone component in the composition. An amount in the range of 0.1 to 20 parts by weight is even more desirable, and an amount in the range of 0.1 to 10 parts by weight is especially desirable. Note that if the content of this unsaturated compound is less than the lower limit of the above-mentioned range, there tends to be an insufficient endowment of the resulting cured silicone product with matte properties. On the other hand, if the content exceeds the upper limit of the abovementioned range, the mechanical characteristics of the resulting cured silicone product tend to deteriorate.

There are no particular restrictions on the curing mechanism of such a curable silicone composition; examples of curing mechanisms which can be used include hydrosilylation reaction curing, condensation reaction curing, ultraviolet irradiation curing, organic peroxide curing and combinations of these curing mechanisms. In particular, hydrosilylation reaction curing, condensation reaction curing or a combination of hydrosilylation reaction curing and condensation reaction curing is especially desirable. Examples of such hydrosilylation reaction curing type curable silicone compositions include compositions that contain a polyorganosiloxane which has at least two alkenyl groups bonded to silicon atoms in each molecule, a polyorganosiloxane which has at least two hydrogen atoms bonded to silicone atoms in each molecule, and a hydrosilylation reaction catalyst. Furthermore, examples of condensation reaction curing type curable silicone compositions include de-alcohol type compositions, de-acetic acid type compositions, de-ketone type compositions and de-amine type compositions. Additional examples of such compositions include compositions that contain at least a) a polyorganosiloxane which has at least two hydroxy groups bonded to silicon atoms, or at least two hydrolyzable groups bonded to silicon atoms (such as alkoxy groups, alkenoxy groups or acetoxy groups, etc.) in each molecule, b) a silane compound which has at least two hydrolyzable groups bonded to silicon atoms (such as alkoxy groups, alkenoxy groups or acetoxy groups, etc.) in each molecule, or a partially hydrolyzed condensate of the such a compound, and c) a condensation reaction catalyst. Furthermore, examples of curable silicone compositions which are a combination of the above-mentioned hydrosilylation reaction curing type and condensation reaction curing type include compositions that contain of at least a) a polyorganosiloxane which has at least two alkenyl groups bonded to silicon atoms and at least two hydrolyzable groups bonded to silicon atoms (such as alkoxy groups, alkenoxy groups or acetoxy groups, etc.) in each molecule, b) a polyorganosiloxane which has at least two hydrogen atoms bonded to silicon atoms in each molecule, c) a hydrosilylation reaction catalyst, and d) a condensation reaction catalyst; and compositions that contain at least a) a polyorganosiloxane which has at least two alkenyl groups bonded to silicon atoms in each molecule, b) a polyorganosiloxane which has at least two hydrolyzable groups bonded to silicon atoms (such as alkoxy groups, alkenoxy groups or acetoxy groups, etc.) in each molecule, c) a polyorganosiloxane which has at least two hydrogen atoms bonded to silicon atoms in each molecule, d) a hydrosilylation reaction catalyst, and e) a condensation reaction catalyst.

The LED display device of a preferred embodiment of the present invention will be described in greater detail in terms of the following examples. Furthermore, the viscosity values indicated in the examples are values measured at 25° C. Moreover, the degree of luster of the mirror surface of the silicone rubber is indicated by the 60-degree mirror surface luster Gs(60°), in which the angle of incidence of the light source is 60°, and the light reception angle is 60°.

Example 5

100 parts by weight of a dimethylvinylsiloxy-terminated polydimethylsiloxane having a viscosity of 2,000 mPa·s, 10 parts by weight of fumed silica with a specific surface area of 200 m$^2$/g whose surface had been subjected to a hydrophobic treatment using hexamethyldisilazane, 5 parts by weight of carbon black, 2 parts by weight of a trimethylsiloxy-terminated dimethylsiloxane-methylhydrogensiloxane copolymer (molar ratio of dimethylsiloxane units to methylhydrogensiloxane units=3:5), 2 parts by weight of tung oil, and an isopropyl alcohol solution of chloroplatinic acid (the amount of chloroplatinic acid added was adjusted so that the amount of platinum metal was 0.001 wt 5% relative to the above-mentioned polydimethylsiloxane), were mixed, thus producing a hydrosilylation reaction curing type silicone rubber composition. The 60-degree mirror surface luster Gs(60°) of the silicone rubber obtained when this silicone rubber composition was cured by being heated for 2 hours at 80° C. and then being allowed to stand for one week at room temperature was 0%.

Next, after a substrate on which LEDs were mounted in a 16×16 matrix was installed in a frame, this frame was filled with the above-mentioned silicone rubber composition so that the LEDs were exposed. This silicone rubber composition was cured by being heated for 2 hours at 80° C., and then allowed to stand for one week at room temperature, thus producing an LED display device. When sunlight was caused to be incident on the display surface of this LED display device, and some of the LEDs were lit while the LED display device was viewed from the direction in which the sunlight was positively reflected by the display surface, the visual recognition characteristics of the lit LEDs versus the unlit LEDs were good.

Example 6

100 parts by weight of a trimethoxysiloxy-terminated dimethylpolysiloxane having a viscosity of 15,000 mPa·s s, 10 parts by weight of fumed silica with a BET specific surface area of 200 m$^2$/g whose surface had been subjected to a hydrophobic treatment using hexamethyldisilazane, 5 parts by weight of carbon black, 0.5 parts by weight of methyl linolenate, 2 parts by weight of diisopropoxybis (ethylacetoacetate)titanium and 2 parts by weight of methyltrimethoxysilane were mixed, thus producing a de-alcohol condensation reaction curing type silicone rubber composition. The 60-degree mirror surface luster Gs(60°) of the silicone rubber obtained when this silicone rubber composition was cured by being heated for 2 hours at 80° C. and then being allowed to stand for one week at room temperature was 0%.

Next, after a substrate on which LEDs were mounted in a 16×16 matrix was installed in a frame, this frame was filled with the above-mentioned silicone rubber composition so that the LEDs were exposed. This silicone rubber composition was cured by being heated for 2 hours at 80° C., and then allowed to stand for one week at room temperature, thus producing an LED display device. When sunlight was caused to be incident on the display surface of this LED display device, and some of the LEDs were lit while the LED display device was viewed from the direction in which the sunlight was positively reflected by the display surface, the visual recognition characteristics of the lit LEDs versus the unlit LEDs were good.

Comparative Example 3

100 parts by weight of a dimethylvinylsiloxy-terminated polydimethylsiloxane with a viscosity of 2,000 mPa·s, 10 parts by weight of fumed silica with a surface area of 200 m$^2$/g whose surface had been subjected to a hydrophobic treatment using hexamethyldisilazane, 5 parts by weight of carbon black, 2 parts by weight of a trimethylsiloxy-terminated dimethylsiloxane-methylhydrogensiloxane copolymer (molar ratio of dimethylsiloxane units to methylhydrogensiloxane units=3:5), and an isopropyl alcohol solution of chloroplatinic acid (the amount of chloroplatinic acid added was adjusted so that the amount of platinum metal was 0.001 wt % relative to the abovementioned polydimethylsiloxane), were mixed, thus producing a hydrosilylation reaction curing type silicone rubber composition. The 60-degree mirror surface luster Gs(60°) of the silicone rubber obtained when this silicone rubber composition was cured by being heated for 2 hours at 80° C. and then being allowed to stand for one week at room temperature was 90%.

Next, after a substrate on which LEDs were mounted in a 16×16 matrix was installed in a frame, this frame was filled with the above-mentioned silicone rubber composition so that the LEDs were exposed. This silicone rubber composition was cured by being heated for 2 hours at 80° C., and then allowed to stand for one week at room temperature, thus producing an LED display device. When sunlight was caused to be incident on the display surface of this LED display device, and some of the LEDs were lit while the LED display device was viewed from the direction in which the sunlight was positively reflected by the display surface, the distinction between lit LEDs and unlit LEDs was unclear, so that the visual recognition characteristics were poor.

Thus, the LED display device of a preferred embodiment of the present invention is characterized by the fact that a) the gaps between a plurality of LEDs mounted on a substrate are filled with a cured silicone product, and b) in spite of the fact that the abovementioned LEDs and cured silicone product are exposed, the visual recognition characteristics of lit LEDs versus unlit LEDs are superior even when light is incident from the outside.

What is claimed is:

1. A curable silicone composition consisting essentially of:
    (A) at least one air oxidation-curable unsaturated compound;
    (B) a polyorganosiloxane having at least two silicon-bonded hydrolyzable groups or silanol groups in one molecule; and
    (C) a cross-linking agent.

2. A composition according to claim 1, wherein (A) is at least one compound selected from the group consisting of unsaturated higher fatty acids, unsaturated higher fatty acid esters, unsaturated hydrocarbons, and their polymers.

3. A composition according to claim 1, wherein (A) is selected from the group consisting of linoleic acid, linolenic acid, linolic acid, tung oil, linseed oil, soybean oil, methyl linolenate, methyl linolate, butadiene, pentadiene, 1,3-hexadiene, cyclopentadiene, 1,3-cyclohexadiene, 1,3,5-cycloheptatriene, and mixtures thereof.

4. A composition according to claim 1, wherein the hydrolyzable group of Component (B) is selected from the group consisting of alkoxy groups, alkenyloxy groups, alkoxyalkoxy groups, acyloxy groups, ketoxime groups, amino groups, aminoxy groups, and amide.

5. A composition according to claim 1, wherein (C) is a compound having the formula $R_aSiX_{4-a}$ or a product of a partial hydrolytic condensation of a compound having the formula $R_aSiX_{4-a}$ wherein R is at least one group independently selected from the group consisting of monovalent hydrocarbon groups, epoxy-functional monovalent organic groups, and acrylic-functional monovalent organic groups, a has a value of 0, 1, or 2, and X is a silicon-bonded hydrolyzable group.

6. A composition according to claim 5, wherein the monovalent hydrocarbon group is selected from the group consisting of methyl, ethyl, propyl, butyl, pentyl, hexyl, heptyl, octyl, nonyl, decyl, octadecyl, cyclopentyl, cyclohexyl, vinyl, allyl, phenyl, tolyl, xylyl, naphthyl, benzyl, phenethyl, phenylpropyl, 3-chloropropyl, and 3,3,3-trifluoropropyl, the epoxy-functional monovalent organic group is selected from the group consisting of 4-oxylanylbutyl, 8-oxylanyloctyl, 3-glycidoxypropyl, 4-glycidoxybutyl, and 2-(3,4-epoxycyclohexyl)ethyl, and the acrylic-functional monovalent organic group is selected from the group consisting of 3-methacryloxypropyl and 4-methacryloxybutyl, a has a value of 1, and the hydrolyzable group of X is selected from the group consisting of alkoxy groups, alkoxyalkoxy groups, acyloxy groups, ketoxime groups, alkenyloxy groups, amino groups, aminoxy groups, and amide groups.

7. A composition according to claim 3, wherein (C) is a compound having the formula $R_aSiX_{4-a}$ or a product of a partial hydrolytic condensation of a compound having the formula $R_aSiX_{4-a}$ wherein R is at least one group independently selected from the group consisting of monovalent hydrocarbon groups, epoxy-functional monovalent organic groups, and acrylic-functional monovalent organic groups, a has a value of 0, 1, or 2, and X is a silicon-bonded hydrolyzable group.

8. A composition according to claim 7, wherein the monovalent hydrocarbon group is selected from the group consisting of methyl, ethyl, propyl, butyl, pentyl, hexyl, heptyl, octyl, nonyl, decyl, octadecyl, cyclopentyl, cyclohexyl, vinyl, allyl, phenyl, tolyl, xylyl, naphthyl, benzyl, phenethyl, phenylpropyl, 3-chloropropyl, and 3,3,3-trifluoropropyl, the epoxy-functional monovalent organic group is selected from the group consisting of 4-oxylanylbutyl, 8-oxylanyloctyl, 3-glycidoxypropyl, 4-glycidoxybutyl, and 2-(3,4-epoxycyclohexyl)ethyl, and the acrylic-functional monovalent organic group is selected from the group consisting of 3-methacryloxypropyl and 4-methacryloxybutyl, a has a value of 1, and the hydrolyzable group of X is selected from the group consisting of alkoxy groups, alkoxyalkoxy groups, acyloxy groups, ketoxime groups, alkenyloxy groups, amino groups, aminoxy groups, and amide groups.

9. A composition according to claim 1, wherein the composition further contains a condensation reaction catalyst.

10. A composition according to claim 9, wherein the condensation reaction catalyst is selected from the group consisting of tetrabutyl titanate, tetraisopropyl titanate, diisopropoxybis(acetylacetate) titanium, diisopropoxybis(ethylacetoacetate) titanium, aluminum tris(acetylacetonate), aluminum tris(ethylacetoacetate), zirconium tetra(acetylacetonate), zirconium tetrabutylate, dibutyltin dioctanoate, dibutyltin dilaurate, butyltin-2-ethylhexanoate, stannous naphthenate, stannous oleate, stannous butylate, cobalt naphthenate, zinc stearate, hexylamine, dodecylamine phosphate, benzyltriethylammonium acetate, potassium acetate, lithium nitrate, dimethylhydroxylamine, diethylhydroxylamine, and guanidyl-containing organosilicon compounds.

11. A composition according to claim 7, wherein the composition further contains a condensation reaction catalyst.

12. A composition according to claim 11, wherein the condensation reaction catalyst is selected from the group consisting of tetrabutyl titanate, tetraisopropyl titanate, diisopropoxybis(acetylacetate) titanium, diisopropoxybis(ethylacetoacetate) titanium, aluminum tris(acetylacetonate), aluminum tris(ethylacetoacetate), zirconium tetra(acetylacetonate), zirconium tetrabutylate, dibutyltin dioctanoate, dibutyltin dilaurate, butyltin-2-ethylhexanoate, stannous naphthenate, stannous oleate, stannous butylate, cobalt naphthenate, zinc stearate, hexylamine, dodecylamine phosphate, benzyltriethylammonium acetate, potassium acetate, lithium nitrate, dimethylhydroxylamine, diethylhydroxylamine, and guanidyl-containing organosilicon compounds.

13. A method of making a curable silicone composition consisting essentially of: (I) mixing:

(A) at least one air oxidation-curable unsaturated compound;

(B) a polyorganosiloxane having at least two silicon-bonded hydrolyzable groups or silanol groups in one molecule;

(C) a cross-linking agent; and (D) optionally a condensation catalyst.

14. A method according to claim 13, wherein (A) is selected from the group consisting of linoleic acid, linolenic acid, linolic acid, tung oil, linseed oil, soybean oil, methyl linolenate, methyl linolate, butadiene, pentadiene, 1,3-hexadiene, cyclopentadiene, 1,3-cyclohexadiene, 1,3,5-cycloheptatriene, and mixtures thereof.

15. A composition according to claim 1, wherein the composition further contains at least one ingredient selected from the group consisting of inorganic fillers, hydrophobic inorganic fillers obtained by surface treating a filler with a component selected from the group consisting of organoalkoxysilanes, organohalosilanes, organosilazanes, and siloxane oligomers, organic solvents, non-crosslinkable organopolysiloxanes, pigments, flame resistance-imparting agents, heat resistance-imparting agents, sensitizers, polymerization inhibitors, anti-oxidants, internal mold release agents, plasticizers, thixotropicity-imparting agents, adhesion accelerators, and fungicides.

16. A method according to claim 13, wherein the method further includes at least one ingredient selected from the group consisting of inorganic fillers, hydrophobic inorganic fillers obtained by surface treating a filler with a component selected from the group consisting of organoalkoxysilanes, organohalosilanes, organosilazanes, and siloxane oligomers, organic solvents, non-crosslinkable organopolysiloxanes, pigments, flame resistance-imparting agents, heat resistance-imparting agents, sensitizers, polymerization inhibitors, anti-oxidants, internal mold release agents, plasticizers, thixotropicity-imparting agents, adhesion accelerators, and fungicides.

* * * * *